United States Patent [19]

Saleh

[11] Patent Number: 5,017,885
[45] Date of Patent: May 21, 1991

[54] OPTICAL AMPLIFIER WITH REDUCED NONLINEARITY

[75] Inventor: Adel A. M. Saleh, Holmdel, N.J.

[73] Assignee: AT&T Bell Laboratories, Murray Hill, N.J.

[21] Appl. No.: 590,551

[22] Filed: Sep. 28, 1990

Related U.S. Application Data

[63] Continuation of Ser. No. 352,682, May 10, 1984, abandoned, which is a continuation of Ser. No. 221,952, Jul. 20, 1988, abandoned.

[51] Int. Cl.$^5$ .............................. H01S 3/06; H01S 3/13
[52] U.S. Cl. ..................................... 330/4.3; 455/611; 370/3
[58] Field of Search ........................ 330/4.3; 332/7.51; 455/601, 611, 609; 370/3

[56] References Cited

U.S. PATENT DOCUMENTS

| 4,364,014 | 12/1982 | Gray | 330/4.3 |
| 4,462,004 | 7/1984 | Cox et al. | 330/277 |
| 4,772,854 | 9/1988 | Silberberg | 330/4.3 |

FOREIGN PATENT DOCUMENTS

| 0174729 | 3/1986 | European Pat. Off. |
| 0224070 | 6/1987 | European Pat. Off. |
| 8700298 | 11/1987 | PCT Int'l Appl. |

OTHER PUBLICATIONS

"Nonlinear Models of Travelling-Wave Optical Amplifiers", Electronics Letters, vol. 24, No. 14, Jul. 7, 1988, by A. A. M. Saleh, pp. 835-837.
R. M. Jopson et al., "Measurement of Carrier-Density Mediated Intermodulation Distortion in an Optical Amplifier", Electronics Letters, vol. 23, 1987, pp. 1394-1395.
G. Grosskopf et al., "Four-Wave Mixing in a Semiconductor Laser Amplifier", Electronics Letters, vol. 24, 1988, pp. 31-32.
T. E. Darcie et al., "Nonlinear Interactions in Optical Amplifiers for Multifrequency Lightwave Systems", Electronics Letters, vol. 24, 1988, pp. 1175-1177.
G. P. Agrawal, "Amplifier-Induced Crosstalk in Multichannel Coherent Lightwave Systems", Electronics Letters, vol. 23, 1987, pp. 1175-1177.
M. G. Oberg et al., "Crosstalk Between Intensity-Modulated Wavelength-Division Multiplexed Signals in a Semiconductor Laser Amplifier", IEEE J. Quantum Electronics, vol. QE-24, 1988, pp. 52-59.
G. P. Agrawal, "Four-Wave Mixing and Phase Conjugation in Semiconductor Laser Media", Opt. Lett., vol. 12, 1987, pp. 260-262.
G. P. Agrawal et al., "Long-Wavelength Semiconductor Lasers", (Van Nostrand Reinhold, N.Y., 1986, Chapter 2).
H. Seidel, "A Feedforward Experiment Applied to an L-4 Carrier System Amplifier", IEEE Trans. on Communication Technology, vol. COM-19, Jun. 1971, pp. 320-325.
M. Kumar et al., "Dual-Gate MESFET Variable-Grain Constant-Output Power Amplifier", IEEE Trans. on Microwave Theory and Techniques, vol. MTT-29, Mar. 1981, pp. 185-189.
Jopson et al., "Measurement of Carrier Density . . . Amplifier", 12/3/87, Electron. Lett. (UK), vol. 23, #25, pp. 1394-1395.
Gajda et al., "A Linearization System using RF Feedback", 9/28/83, I.E.E. Conf., Toronto, Canada, pp. 30-33, vol. 1, Abst. only.
Snyder D. F.; "Improving the Resolution . . . Measurements", Microwave Journal, vol. 29, #5, pp. 352-353, 5/86; Abst. only.
Darcie et al., "Intermodulation Distortion . . . Modulation", Elect. Lett., vol. 23, #25, p. 1392-1394, 12/3/87, Abst. only.

Primary Examiner—Nelson Moskowitz
Attorney, Agent, or Firm—Samuel H. Dworetsky

[57] ABSTRACT

An improved optical amplifier is disclosed with reduced signal-induced, deleterious, nonlinear effects, such as crosstalk, inter-modulation distortion and other saturation-induced effects. The invention comprises an optical amplifier with a compensation loop, such as a feed-forward or a feed-backward loop. This loop provides additional pumping to the gain medium associated with the amplifier, thereby compensating for what would otherwise be deleterious, signal-induced variations in the gain of the optical amplifier.

6 Claims, 9 Drawing Sheets

OPTICAL AMPLIFIER WITH REDUCED NONLINEARITY

This application is a continuatin of application Ser. No. 352,682 filed on May 10, 1989, now abandoned, which is a continuation of application Ser. No. 221,952, filed on Jul. 20, 1988, now abandoned.

TECHNICAL FIELD

This invention relates to optical amplifiers, and to optical communication systems utilizing such optical amplifiers.

BACKGROUND OF THE INVENTION

Optical amplifiers are emerging as practical components for use in various lightwave communication systems. Such optical amplifiers can enhance the performance of lightwave communication systems by boosting signal levels to overcome noise. However, generally, the gain of such amplifiers, and specifically the gain of preferred semiconductor optical amplifiers, is inherently nonlinear. Such nonlinearity can cause adverse, and potentially harmful, effects such as gain saturation, inter-modulation distortion (IMD) in frequency-division-multiplexed (FDM) systems employing closely spaced carriers (see, T. E. Darcie et al, Electron. Lett., 1987, Vol. 23, pp. 1392–1394; R. M. Jopson et al, Electron. Lett., 1987, Vol. 23, pp. 1394–1395; G. Grosskopf et al, Electron. Lett., 1988, Vol. 24, pp. 31–32; and T. E. Darcie et al, Electron. Lett., 1988, Vol. 24, pp. 638–640), crosstalk in wavelength-division-multiplexed (WDM) systems employing widely spaced on-off-keyed (OOK) or amplitude shift keyed (AMK) carriers (see, G. P. Agrawal et al, Electron. Lett., Vol. 23, pp. 1175–1177; and M. G. Oberg et al, IBEE J. Quantum Electron., 1988, Vol. QE-24, pp. 52–59, and pulse distortion in multi-Gb/s intensity-modulation systems, even those employing a single carrier.

Each of the above-mentioned nonlinear effects results from the coupling between the excited state density, and, hence, the optical gain, and the optical intensity within the amplifier. Gain saturation reduces the total output power of the amplifier for large input powers. Inter-modulation distortion (IMD) results from modulation of the gain by beating between closely spaced optical signals, and limits the maximum useable output power, or the minimum channel separation, in multi-channel frequency division multiplexed systems. Regardless of the channel separation, intensity modulation in one channel leads to modulation of the gain available for other channels. The resultant saturation induced crosstalk (SIC) impairs all multi-channel amplifier applications that use amplitude shift keying (ASK).

Some of these effects have been investigated theoretically (see, T. E. Darcie et al, Electron. Lett., 1987, Vol. 23, pp. 1392–1394; T. E. Darcie et al, Electron. Lett., 1988, Vol. 24, pp. 638–640; and G. P. Agrawal et al, Electron. Lett., 1987, Vol. 23, pp. 1175–1177) through the solution of a pair of coupled partial differential equations—the wave equation and the rate equation (see, G. P. Agrawal, Opt. Lett., 1987, Vol. 12, pp. 160–262; and G. P. Agrawal et al, Long-wavelength Semiconductor Lasers, Van Nostrand Reinhold, New York, 1986, Chapter 2). However, this technique is somewhat complex and is generally not suitable for analysis involving arbitrary input signals, particularly those having multi-Gb/s carriers.

These nonlinear effects can be made negligible by reducing the amplifier input power to a sufficiently low value. However, this can defeat the object of using such amplifiers. It is well known that by using constant-envelope modulation the inter-modulation distortion (IMD) in frequency division multiplexed (FDM) systems can be made acceptable by increasing the intercarrier separation to more than a few GHz. However, this may lead to an unacceptably inefficient use of the spectrum in multi-channel applications.

SUMMARY OF THE INVENTION

This invention is an improved optical amplifier with reduced signal-induced nonlinear effects such as crosstalk, inter-modulation distortion and other saturation induced effects. In the inventive optical amplifier, a compensation loop, such as a feed-forward or feed-back loop, is used to reduce the signal induced saturation, and therefore, the signal induced nonlinearities. The loop operates by providing additional, signal-induced pumping to the gain medium associated with the amplifier, thereby compensating for what would otherwise be signal induced variations in the gain of the optical amplifier. In many applications, it is found that equalization in the compensation loop is unnecessary because of the inherent equalization associated with the frequency response of the gain medium. In such applications, a compensation loop with a substantially flat frequency response is sufficient to compensate adequately for the signal-induced variations in the gain of the optical amplifier.

DETAILED DESCRIPTION

Figure 1:
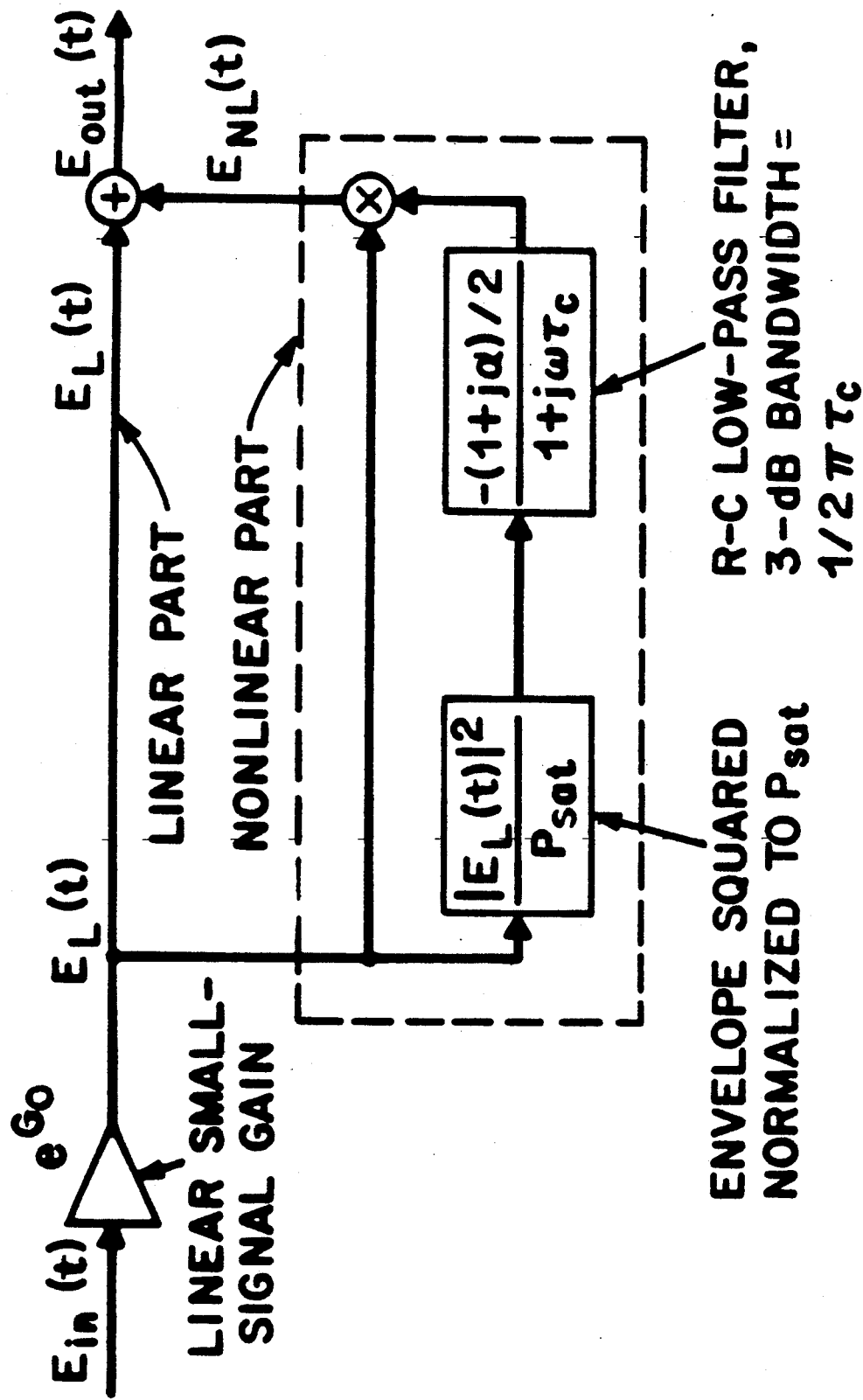
FIG. 1 is a small-signal model of an optical amplifier.

The invention is an improved optical amplifier with reduced signal-induced nonlinearities. In the inventive device, an appropriate compensation loop provides additional, signal-induced pumping to the gain medium thereby compensating for what would otherwise be signal-induced variations in the gain of the optical amplifier. In section I below, the coupled, partial differential, wave and rate equations are used to develop general-purpose small-signal and large-signal nonlinear optical-amplifier models that are much more suitable for communications-systems analysis than previous solutions. In section II below, a practical feed-forward linearization scheme is presented that is capable of significantly reducing signal-induced nonlinear distortions, without reducing the required output power, or increasing the desired inter-carrier separation. To demonstrate the effectiveness of this scheme, a two-tone circuit is described which shows a reduction of the inter-modulation distortion by about 14 dB. In effect, this would allow the operation of the amplifier with an increased output power of 7 dB—half the IMD reduction. In section III, a simple feed-forward circuit is shown to reduce saturation-induced crosstalk in wavelength-multiplexed on-off-keyed optical amplifier applications. A two-channel circuit is described which reduces crosstalk by 20 dB while the effective gain of the amplifier is increased by 3 dB.

I. NONLINEAR MODELS OF TRAVELING-WAVE OPTICAL AMPLIFIERS

In this section, the coupled, partial differential, wave and rate equations are used to develop general-purpose small-signal and large-signal nonlinear optical-amplifier models that are much more suitable for communications-systems analysis than previous solutions.

The Wave Equations

Let the electric field of the optical wave propagating in the z-direction through a traveling-wave amplifier be denoted by $\hat{E}(z,t) = E(z,t) \exp[j(\omega t - kz)]$, where $E(z,t)$ is the complex envelope, $\omega = 2\pi\nu$ is the optical angular frequency ($\nu$ being the frequency) and $k = \omega n/c$ is the nominal propagation constant (n being the refractive index and c being the speed of light). This field has to obey the wave equation (see, G. P. Agrawal, Opt. Lett., 1987, Vol. 12, pp. 160-262; and G. P. Agrawal et al, Long-wavelength Semiconductor Lasers, Van Nostrand Rheinhold, New York, 1986, Chapter 2).

$$\frac{\partial^2}{\partial z^2} \hat{E}(z,t) = \frac{\partial^2}{\partial t^2} \left[ \frac{n^2}{c^2} + j\frac{n}{\omega c}(1+j\alpha)g(z,t) \right] \hat{E}(z,t), \quad (1)$$

where $\alpha(\approx 5)$ is the linewidth enhancement factor and $g(z,t)$ is the incremental gain. Observing that the optical period is much shorter than the photon transit time through the amplifier, which, in turn, is much smaller than the time scale of envelope and gain variations, one can make the approximate operator substitutions: $\delta^2/\delta t^2 \to (j\omega)^2$ and $\delta^2/\delta z^2 \to (-jk)^2 \to j2k\delta/\delta z$. In this case, upon integration, (1) yields the solution $$E_{out}(t) \approx E_{in}(t) \exp[G(t)(1+j\alpha)/2], \quad (2)$$

where $$G(t) = \int_0^L g(z,t)dz,$$

L ($\approx 0.3$ mm) is the amplifier's length, $\exp[G(t)]$ is the total power gain, $E_{in}(t) = E(0,t)$ is the input field and $E_{out}(t) = E(L,t)$ is the output field.

The Rate Equation

The carrier density, $N(z,t)$, with in the active region of the amplifier is governed by a rate equation (see, G. P. Agrawal, Opt. Lett., 1987, Vol. 12, pp. 160-262; and G. P. Agrawal et al, Long-wavelength Semiconductor Lasers, Van Nostrand Reinhold, N.Y., 1986, Chapter 2) relating to the propagating optical field, $E(z,t)$. It is more convenient for our purpose to cast this equation in terms of the incremental gain, $g(z,t)$, which is linearly related to $N(z,t)$ through the relation: $g(z,t) = \Gamma a [N(z,t) - N_0]$, where $\sigma(\approx 0.3)$ is the confinement factor, a ($\approx 3\times 10^{-16}$ cm$^2$) is the gain coefficient, and $N_0(\approx 10^{18}$ cm$^{-3})$ is the carrier density at which the material becomes transparent. Let the incremental gain with small (or zero) input signal be denoted by $g_0 = \Gamma a[N_0 - N_0]$, where $N_0$ is the carrier density due to the d-c current injected into the active region. In this case, the rate equation becomes $$\tau_c \frac{\partial}{\partial t} g(z,t) = -[g(z,t) - g_0] - \frac{1}{P_{sat}} \frac{\partial}{\partial z} E(z,t)^2, \quad (3)$$

where $\tau_c (\approx 0.3$ nsec) is the carrier lifetime, and $P_{sat} (\approx 1$ mW) is the gain-saturation power (at which $g = g_0/2$). It is noted that $P_{sat} = I_{sat} A/\Gamma$, where $I_{sat} = h\nu/a\tau_c$ is the gain-saturation intensity, $h\nu$ is the photon energy and A ($\approx 0.4$ $\mu$m$^2$) is the cross-sectional ara of the active region. In writing (3), the electric field is normalized such that $E(z,t)^2$ represents the optical power in watts. Using the terminology of (2) and making use of the fact that the photon transmit time is much smaller than the time scale of the envelope and gain variations, one can integrate (3) with respect to z to obtain the total differential equation $$\left[ 1 + \tau_c \frac{d}{dt} \right][G(t) - G_0] = -[|E_{out}(t)|^2 - |E_{in}(t)|^2]/P_{sat}, \quad (4a)$$

$$\approx -|E_{out}(t)|^2/P_{sat}, \quad (4b)$$

where $G_0 = g_0 L$ is the small signal power gain exponent. The approximation of (4b) is quite valid if the amplifier has a gain of 10 dB or more, which is the usual case of practical interest.

Iterative Solution

Equations (2) and (4) represent the input-output relations of an amplifier in terms of the three physical constants, $\alpha$, $\tau_c$ and $P_{sat}$, and the small-signal power gain, $\exp(G_0)$. In principle, they can be solved iteratively. For example, if one has a reasonable first guess at the output envelope, $E_{out}(t)$, the righ-hand side of (4) would be known, and the differential equation can be solved for $G(t)$. This most conveniently done by observing that (4) implies that $G(t) - G_0$ can be considered as the output response of a low-pass R-C filter with a time constant of $\tau_c$, i.e., a frequency response of $1/(1+j\omega\tau_c)$, with the right-hand side of (4) as an input. (With $\tau_c \approx 0.3$ nsec, (see, R. M. Jopson et al, Electron. Lett., 1987, Vol. 23, pp. 1394-1395) this filter has a 3-dB bandwidth of $\frac{1}{2}\pi\tau_c \approx 0.5$ GHz.) Symbolically, this is written as $$\Delta G(t) = G(t) - G_0 = -F_{\tau c}[|E_{out}(t)|^2/P_{sat}]. \quad (5)$$

where $F_{\tau c}$ represent the low-pass-filtering operation. The resulting estimate of $G(t)$ can now be used in (2) to obtain a better estimate of $E_{out}(t)$. This, in turn, can be substituted in (5) to get the next estimate of $G(t)$, and so on. Realistically, this iterative method of solution can be quite tedious. Thus, some form of approximation is needed to obtain an explicit solution.

Small-Signal Model

Under small-signal drive, i.e., $E_{out}(t)^2 << P_{sat}$, the amplifier is almost linear, and a good first estimate of $E_{out}(t)$ is the linear output, $E_L(t) = E_{in}(t) \exp[G_0(1+j\alpha)/2]$. Substituting this in (5) and using (2) with the approximation $\exp[\Delta G(t)(1+j\alpha)/2] \approx 1 + \Delta G(t)(1+j\alpha)/2$, one obtains the desired output as $$E_{out}(t) \approx E_L(t)\{1-[(1+j\alpha)/2]F_{\tau c}[E_L(t)^2/P_{sat}]\}, \quad (6)$$

which is represented by the block diagram of FIG. 1. As shown in the figure, obtaining the nonlinear part of the output, $E_{NL}(t)$, simply involves low-pass filtering of the normalized squared envelope of the linear part, $E_L(t)$, then up-converting the resulting baseband signal to optical band by multiplying it by $E_L(t)$. These operations can easily be done for a large class of input signals. For example, for multiple, narrow-band carriers, this model directly gives the intermoldulation (see, T. E. Darcie et al, Electron, Lett., 1987, Vol. 23, pp. 1392-1394; and T. E. Darcie et al, Electron. Lett., 1988, Vol. 24 pp. 638-640) crosstalk and asymmetric results (see, G. P. Agrawal et al, Electron. Lett., 1987, Vol. 23, pp. 1175-1177).

Improved Small-Signal Model

Figure 2:
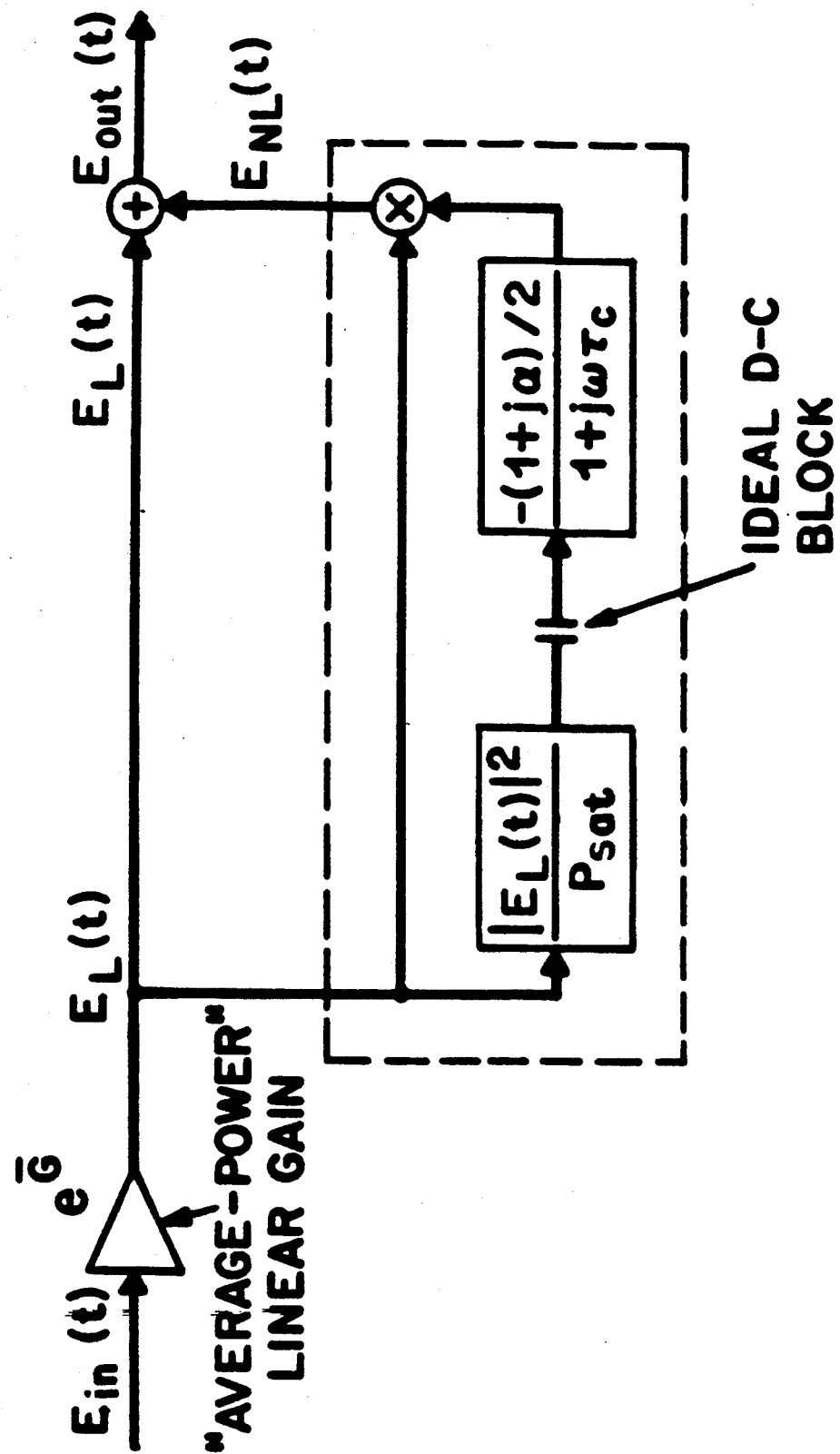
FIG. 2 is an improved small-signal model of an optical amplifier.

FIG. 2 shows an improved small-signal model, where the linear amplifier gain exponent is set to the value, $\overline{G}$, obtained under average-power excitation, rather than to $G_0$. Given the normalized average input power, $\overline{P}_{in} = \overline{E_{in}(t)^2}/P_{sat}$, one can compute $\overline{G}$ from (2) and (4) by setting $d/dt=0$, computing the corresponding normalized output power, $\overline{P}_{out}$, by solving the transcendental equation $\overline{P}_{out}\exp(\overline{P}_{out}) = \overline{P}_{in}\exp(\overline{P}_{in})\exp(G_0)$, then, finally, getting $\overline{G} = \ln(\overline{P}_{out}/\overline{P}_{in})$. Since this process already accounts for the d-c gain saturation of the amplifier, the d-c part of the squared envelope of $E_L(t)$ in the model has to be blocked, as depicted by the ideal capacitor in FIG. 2. Unlike the previous model, this improved model is valid even for large output power as long as the nonlinear distoration, i.e., $E_{NL}(t)$, is small, which is often the case of practical interest.

Large-Signal Model

Figure 3:
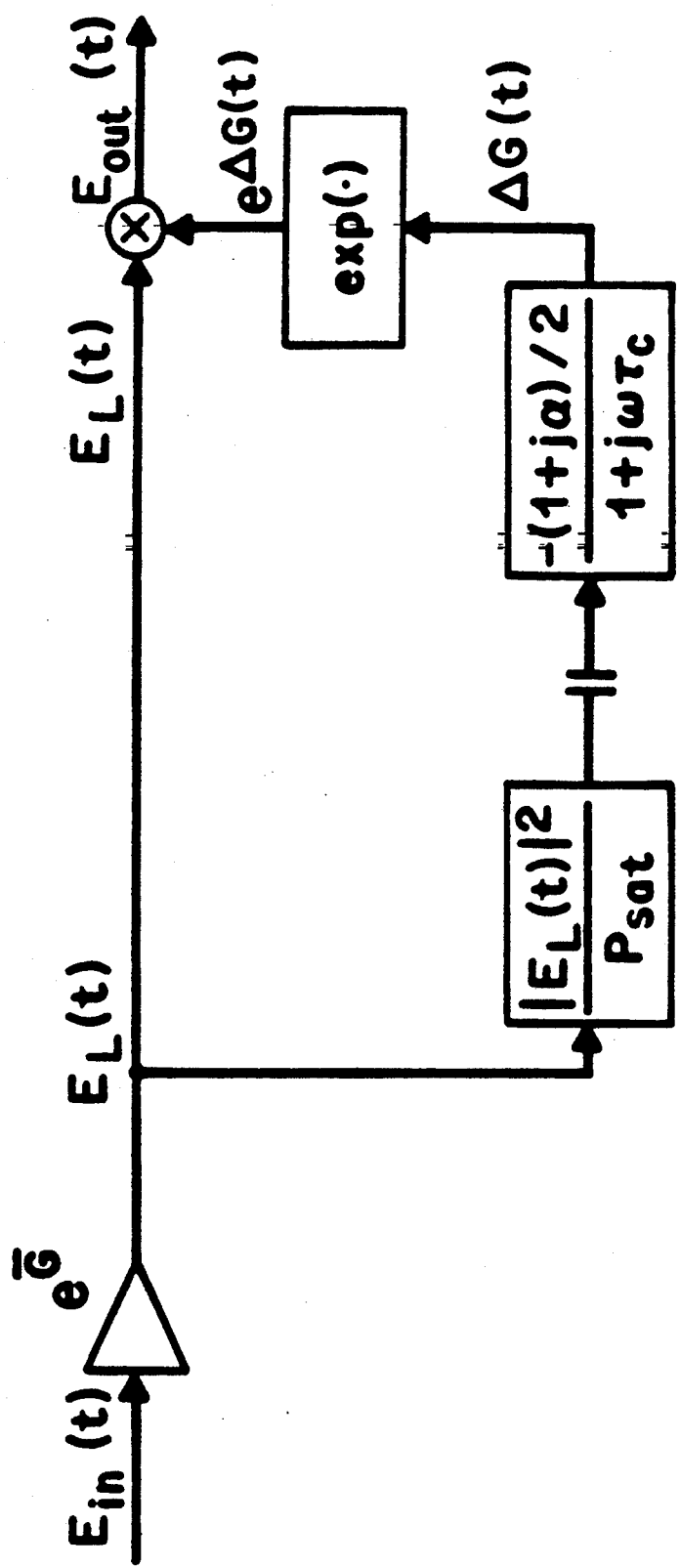
FIG. 3 is a large-signal model of an optical amplifier.

The model of FIG. 2 was made under the assumption that the difference $\Delta G(t) = G(t) - \overline{G}$ between the actual and the average-power gain exponents is small such that $\exp[\Delta G(t)(1+j\alpha)/2] \approx 1 + \Delta G(t)(1+j\alpha)/2$. If this approximation is removed, the more accurate model of FIG. 3 is obtained, which is valid for output powers up to the order of $P_{sat}$. While this model is not as suitable for multi-carrier analysis as the previous two modesl, it is quite suitable for computing the pulse distortion of broadband, intensity-modulated carriers driven near saturation.

Additional Considerations

With a single constant-envelope, FSK or PSK signal, however broadband, the output of the envelope-squared circuit in any of the model is simply a d-c term, which should produce no nonlinear distortion. The same is true for widely-spaced (>a few GHz), constant-envelope carriers, since the beat frequencies emerging from the envelope-squared circuit would not pass through the low-pass filter, whose 3-dB bandwidth is less than 1 GHz. If the spacing is reduced to the order of 1 GHz or less, the beat frequencies would pass through this filter, thus causing intermodulation distortion, even with constant-envelope signals.

Moreover, with widely-spaced, intensity-modulated carriers, the output of the low-pass filter would vary with the combined modulation of all the carriers. This results in changing the effective gain of the amplifier in response to these variations, thus causing potentially damaging crosstalk.

Finally, a single, narrow-band (<100 MHz), square-pulse, intensity-modulated input signal would suffer no harmful nonlinear distortion since its low-pass-filtered squared-envelope remains a sequence of square pulses. However, if the bandwidth of that signal is increased to, say, more than 1 GHz, the low-pass filter would distort the pulses in the nonlinear path, which would result in distortion of the final output pulses.

II. COMPENSATION OF NONLINEARITY IN SEMICONDUCTOR OPTICAL AMPLIFIERS

In this section, a practical feed-forward linearization scheme is presented that is capable of significantly reducing signal-induced nonlinear distortions, without reducing the required output power, or increasing the desired inter-carrier separation. To demonstrate the effectiveness of this scheme, a two-tone circuit is described which shows a reduction of the inter-modulation distortion by about 14 dB. In effect, this would allow the operation of the amplifier with an increased output power of 7 dB—half the IMD reduction.

Theory

Consider a traveling-wave optical amplifier of length L oriented along the z-direction. Let the bias current consist of the usual dc pump component, $I_{dc}$, and an additional ac component, $I_1(t)$, whose form and purpose will be clarified shortly. The carrier density, $N(z,t)$, within the active region is governed by a *rate equation* (see, G. P. Agrawal, Opt. Lett., 1987, Vol. 12, pp. 260-262; and G. P. Agrawal et al, Long-wavelength Semiconductor Lasers, Van Nostrand Reinhold, New York, 1986, Chapter 2) relating it to the propagating optical field. It is more convenient for our purpose to average this equation along the z-direction to obtain $$\frac{d}{dt}\overline{N}(t) = \frac{I_1(t)}{qV} - \frac{\overline{N}(t) - N_p}{\tau_c} - \frac{E_{out}(t)^2 - E_{in}(t)^2}{h\nu V}, \quad (7)$$

where $$\overline{N}(t) = \frac{1}{L}\int_0^L N(z,t)dz,$$

is the space-averaged carrier density, q is the electronic change, V is the active volume, $N_p$ is the carrier density caused by $I_{dc}$, $\tau_c$ is the carrier lifetime, $h\nu$ is the photon energy, and $E_{in}(t)$ and $E_{out}(t)$ are, respectively, the input and output optical fields, which are normalized such that $E^2$ represents optical power.

It can be shown from the scalar *wave equation* that the optical power gain is given by $$G_{optical}(t) = \frac{E_{out}(t)^2}{E_{in}(t)^2} = \exp(L\Gamma a[\overline{N}(t) - N_0]), \quad (8)$$

where $\Gamma$ is the mode confinement factor, a is the gain coefficient and $N_0$ is the carrier density at transparency. The nonlinearity of the amplifier can be directly attributed to the time dependence of the optical gain, which is shown in (2) to be caused by the time variations of $\overline{N}(t)$.

Linearization Scheme

It is clear from (1) that, if one sets $$I_1(t) = \frac{q}{h\nu}(G_{optical} - 1)|E_{in}(t)|^2, \quad (9)$$

then one obtains the solution: $\overline{N}(t) = N_p$; i.e., the average carrier density becomes constant. It, thus, follows from (8) that $G_{optical}$ also becomes constant, and hence, the amplifier becomes linear.

FIG. 11 shows a block diagram of a feed-forward scheme intended to linearize the optical amplifier by fulfilling (9). It consists of an input directional coupler (with power coupling factor, C), a photo-detector (with quantum efficiency, $\mu$) and a baseband amplifier (with *current* gain, $G_c$). The amplifier's output current, $I_1(t)$, is combined with the dc pump current, $I_{dc}$. If K is the power coupling at the input facet of the optical amplifier, then (9) requires $$G_c = \frac{K(1-C)}{\eta C}(G_{optical} - 1). \quad (10)$$

It is crucial to note that, if the optical signal extends over hundreds of gigahertz of bandwidth, as would be the case in many lightwave communications systems, then (3) cannot be fulfilled, since no baseband amplifier can deliver such a signal. However, because of the non-zero value of the carrier lifetime ($\tau_c \approx 0.3$ nsec, (see, R. M. Jopson et al, Electron. Lett., 1987, Vol. 23, pp. 1394–1395) the carrier density cannot respond to variations faster than a few gigahertz (several times $\frac{1}{2}\pi\tau_c$). Thus, the linearizing current, $I_1(t)$, and hence, the baseband amplifier, need not cover frequency components higher than a few gigahertz, irrespective of the optical bandwidth.

One can, in principle, think of replacing the feed-forward path by a feedback path that is coupled from the output side of the optical amplifier. While this reduces the gain requirement of the baseband amplifier, the round-trip delay of the feedback loop needs to be very small.

Experiment

A two-tone experiment (see, R. M. Jopson et al, Electron. Lett., 1987, Vol. 23, pp. 1394–1395) was used to test the effectiveness of our linearization scheme. Two tunable, 1.3-$\mu$m, external-cavity lasers generated two equal-power tones with frequencies $f_1$ and $f_2$. The 1.3-$\mu$m optical amplifier had a chip gain of 24 dB, coupling loss of about 5 dB per facet, and facet reflectivities of about $1\times 10^{-4}$, resulting in less than 1 dB of gain ripples. A portion of the light of one of the tunable lasers (frequency $f_1$) was heterodyned with the amplifier output. The resulting RF signal was displayed on a spectrum analyzer, which was used to measure the amplitudes of the signal at $f_2$ and the IMD product at $2f_2-f_1$. These outputs appeared on the spectrum analyzer at $f_2-f_1$ and $2(f_2-f_1)$, respectively.

Figure 4:
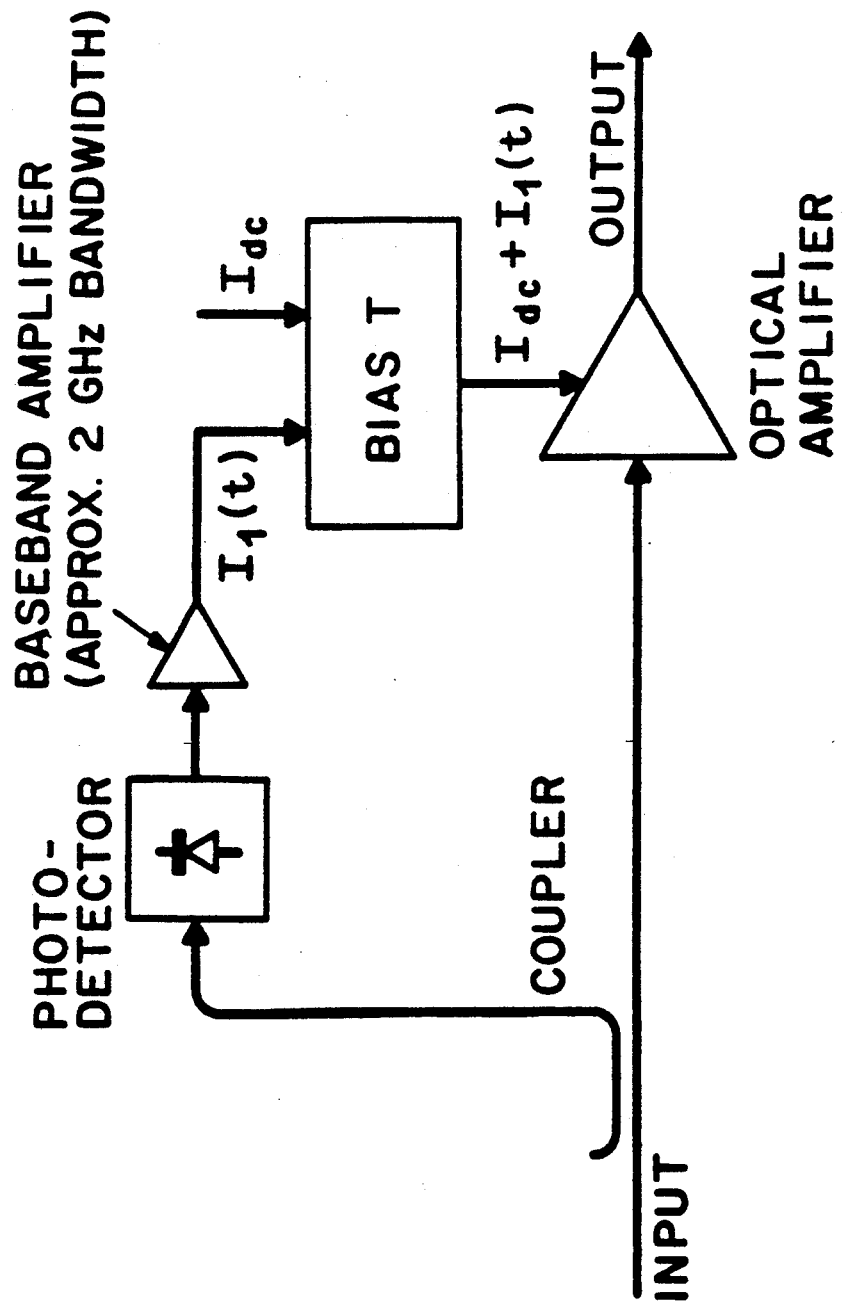
FIG. 4 is a block diagram of the inventive linearization scheme.

The linearizer (FIG. 4) consisted of a 3-dB input coupler, a broadband photo-detector and a 40-dB, low-ripple ($<2$ dB), 2-GHz baseband amplifier. A variable attenuator and a variable delay line were used to adjust the amplitude and delay of the feed-forward bias current, $I_1(t)$.

Figure 5:
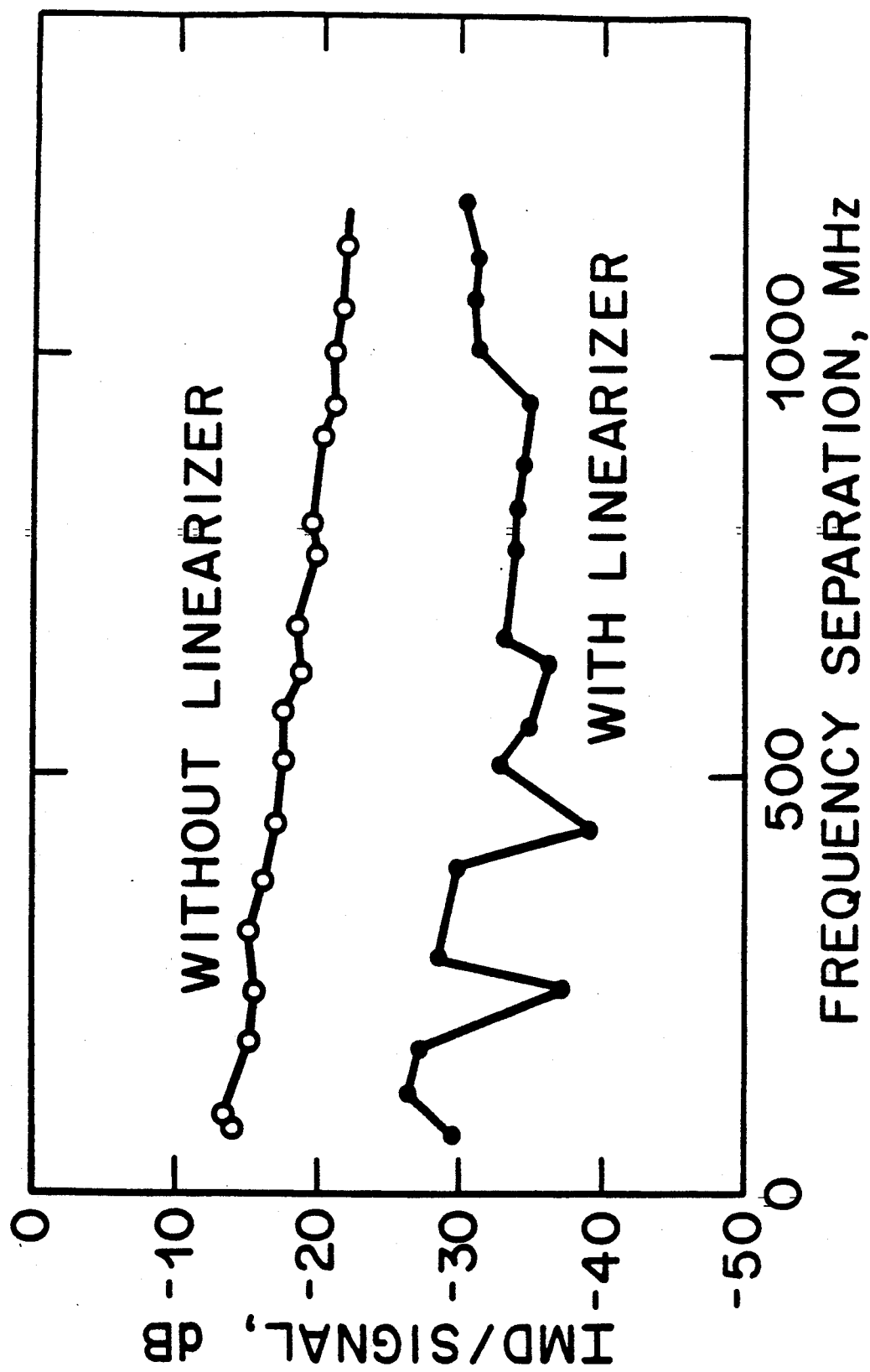
FIG. 5 is an amplifier IMD frequency response with an without the inventive linearizer.

FIG. 5 shows plots of the normalized IMD power versus frequency separation without the linearizer (open circles) and with the linearizer (solid circles). The facet output power of the amplifier in both cases was $-5$ dBm per tone. The figure shows a reduction of the IMD by 10 to 20 dB. The frequency variation is attributed to imperfect frequency response in the feed-forward signal path, particularly, in the baseband amplifier.

Figure 6:
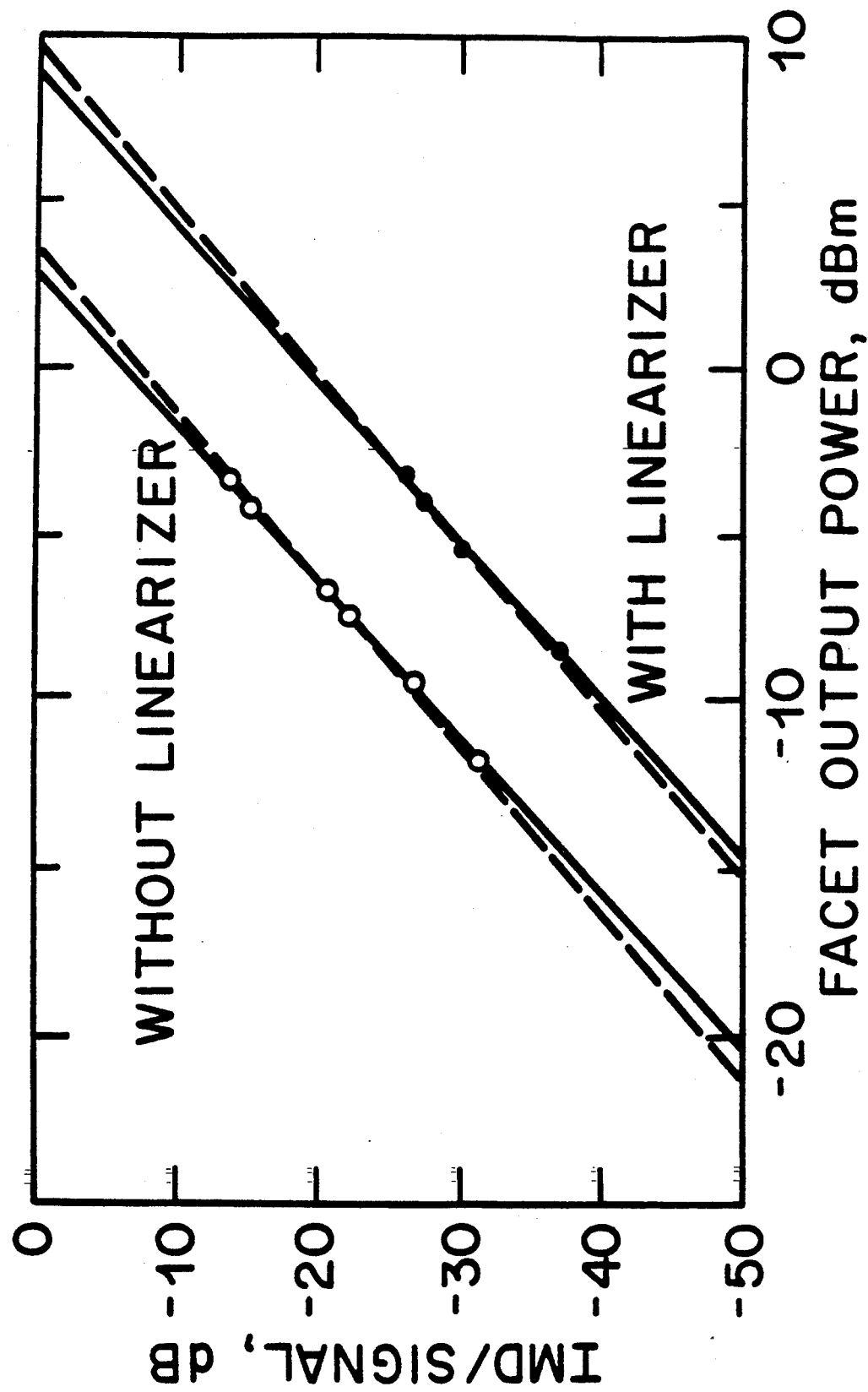
FIG. 6 is a plot of an amplifier IMD versus output power with an without the inventive linearizer.

FIG. 6 shows plots of the normalized IMD versus facet output power per tone without the linearizer (open circles) and with the linearizer (solid circles). The two-tone separation in this case was about 500 MHz. The solid and dashed lines in the figure represent the least-square-error, straight-line fits through the data points, with unconstrained slope and with a slope of two, respectively. This slope indicates that the third-order IMD product is proportional to the cube of the input power, which is expected, at least, for the case without the linearizer (see, T. E. Darcie et al, Electron. Lett., 1987, Vol. 23, pp. 1392–1394; R. M. Jopson et al, Electron. Lett., 1987, Vol. 23, pp. 1394–1395; G. Grosskopf et al, Electron. Lett., 1988, Vol. 24, pp. 31–32; and T. E. Darcie et al, Electron. Lett., 1988, Vol. 24, pp. 638–640). The observed slope of two in FIG. 3 and the 10- to 20-dB improvement in FIG. 2 indicate that, depending on the frequency separation, one can operate the linearized amplifier with a 5- to 10-dB increase in the output power compared to a nonlinearized amplifier operating with the same IMD-to-signal ratio.

It is interesting to think of the linearizer as a means of increasing the *effective* saturation power of the amplifier, which, in our experiment, increased by about 7 dB (about 14-dB reduction in the IMD). We believe that this amount of improvement could be increased even further by reducing the gain ripples of the baseband amplifier. The same order of improvement is expected to hold for arbitrary input signals. Moreover, effective linearization requires the spectrum of the optical signal to be limited to a bandwidth over which the *optical* amplifier has essentially a constant gain, which could be several hundreds of gigaherz in width. The bandwidth of the baseband *electronic* amplifier, on the other hand, does not need to be larger than a few gigahertz, which is related to the inverse of the carrier lifetime.

III. ELECTRONIC COMPENSATION OF SATURATION-INDUCED CROSSTALK

In this section, a simple feed-forward circuit is shown to reduce saturation-induced crosstalk in wavelength-multiplexed on-off-keyed optical amplifier applications. A two-channel circuit is described which reduces crosstalk by 20 dB while the effective gain of the amplifier is increased by 3 dB.

A convenient method for characterizing SIC is to amplify a sinusoidally intensity-modulated signal and an unmodulated probe signal simultaneously, and observing the modulation sidebands induced on the probe. This process can be described theoretically using the rate and the wave equations relating the average carrier density $\overline{N}(t)$ and the instantaneous input and output optical electric fields $E_{in}(t)$ and $E_{out}(t)$:

$$\frac{d\overline{N}(t)}{dt} \approx \frac{N_p - \overline{N}(t)}{\tau_c} - \frac{|E_{out}(t)|^2}{h\nu V}, \quad (11)$$

$$E_{out}(t) = E_{in}(t)\exp(L\Gamma a[\overline{N}(t) - N_o](1+j\alpha)/2), \quad (12)$$

where $\overline{N}(t)$ is averaged over the length of the amplifier L, the electric field is normalized such that $|E|^2$ has the dimensions of power, $h\nu$ is the photon energy, $\tau_c$ is the carrier lifetime, $N_p(=I\tau_c/qV)$ is the carrier density corresponding to the injection current I, V is the volume of the active region, q is the electronic charge, $\alpha$ is the linewidth enhancement factor, $\Gamma$ is the mode confinement factor, a is the gain constant, $N_o$ is the carrier density at which the material becomes transparent, and waveguide losses are neglected. The sinusoidally modulated signal at the output of the amplifier is given by:

$$E_{out}(t) = E_m e^{j(2\pi\nu t + \phi(t))}[1 + m\cos\omega_m t]^{\frac{1}{2}}, \quad (13)$$

where m is the modulation index and $\omega_m$ is the modulation frequency. The phase factor $\phi(t)$ accounts for frequency modulation or chip that results from the intensity modulation. We assume that the modulated signal (L1) is much larger than the probe signal (L2). With Eqn. 3, Eqn. 11 can be solved easily for $\overline{N}(t)$:

$$\overline{N}(t) = N_p - \quad (14)$$

$$\frac{\tau_c |E_m|^2}{h\nu V}\left[1 + \frac{m}{2}\left(\frac{e^{j\omega_m t}}{1 + j\omega_m \tau_c} + \frac{e^{-j\omega_m t}}{1 - j\omega_m \tau_c}\right)\right].$$

The probe signal is then amplified with a gain ($E_{out}/E_{in}$) given by Eqn. 12, with $\overline{N}(t)$ given by Eqn. 14, resulting in the generation of modulation sidebands. It can be shown that the ratio of power of one sideband to the carrier (SCR), which is a direct measure of the crosstalk, is given by:

$$SCR = \frac{m^2}{16}\frac{1 + \alpha^2}{1 + \omega_m^2 \tau_c^2}\left[\frac{|E_m|^2}{P_{sat}}\right]^2, \quad (15)$$

where $P_{sat} = (h\nu V/a\tau_c\Gamma L)$ is the saturation power of the amplifier. Since the response of the gain to intensity fluctuations is damped by the carrier lifetime, the SCR decreases for increased modulation frequencies.

Figure 7:
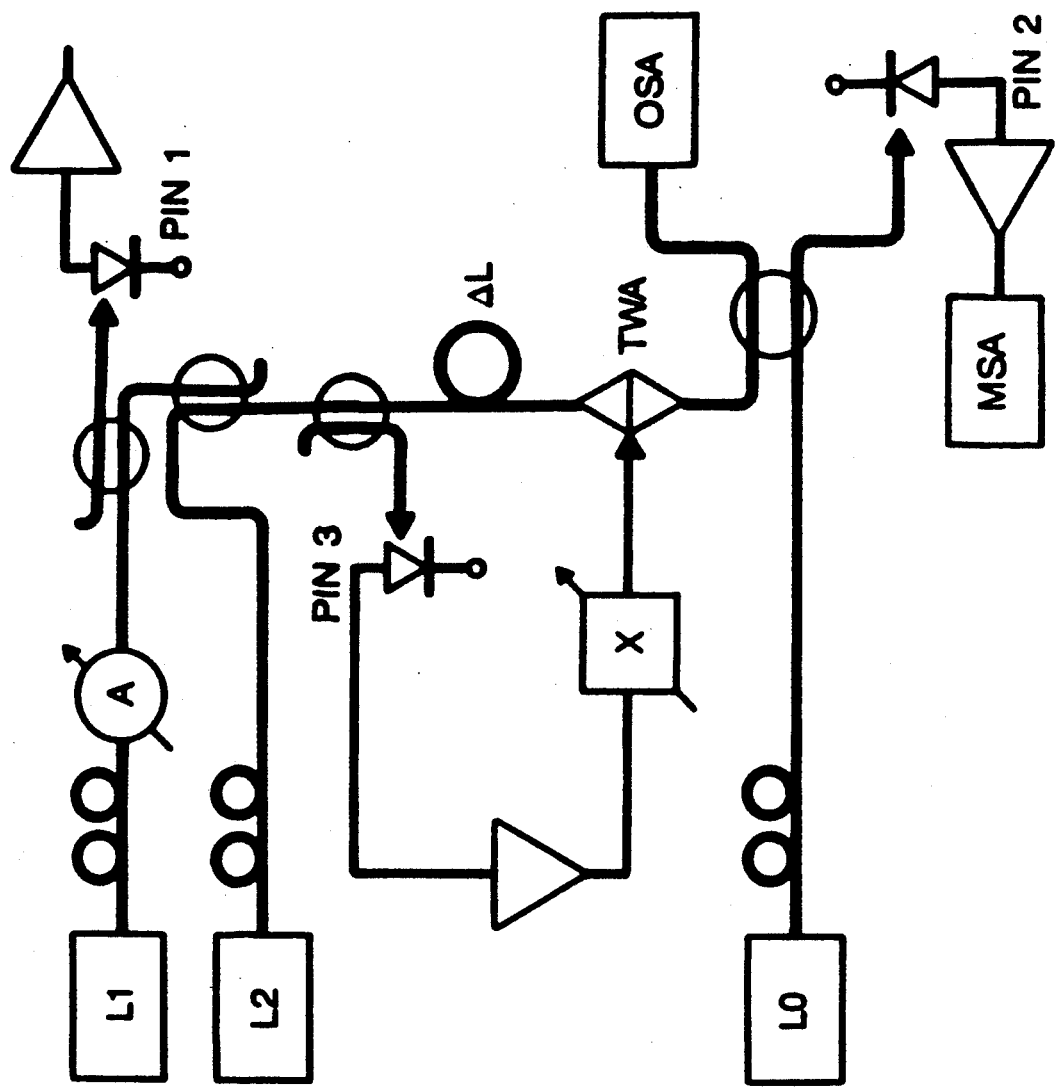
FIG. 7 is a system for measuring and eliminating crosstalk in a traveling-wave amplifier (TWA)

FIG. 7 shows the experiment used to measure SIC and the linearizer circuit that compensates for the gain fluctuations. By sampling the optical intensity at the input to the amplifier and using an electronic feed-forward circuit, the linearizer modifies the injected current such that the right hand side of Eqn. 11 is zero. Ideally, the gain is then constant and the SCR=0. Optical signals L1, from a DFB laser with a wavelength of 1305 nm, and L2, from a gating-tuned external-cavity laser with a wavelength of 1290 nm, are amplified simultaneously. The traveling wave-amplifier has residual refectivities of $2\times10^{-4}$, providing a fiber-to-fiber gain of 14 dB with a $\pm0.5$ dB gain ripple. Fiber-to-fiber coupling losses, including an optical isolator at the output, total 10 dB. High-speed InGaAs photodiodes PIN1 and PIN2 are used for direct detection of the intensity modulated L1 signal and for heterodyne detection of the output from the amplifier, respectively. A second external-cavity laser, operated at a frequency within 2 GHz of L2, is used as a local oscillator. The linearizer uses the third photodiode PIN3 to sample the intensity of the signal at the input to the amplifier. The sampled signal is amplified by approximately 50 dB and used to modulate the amplifier bias. A fiber delay $\Delta L$ and a microwave variable phase shifter (not shown) are used to equalize the propagation delay for the detected electronic signal and the optical signal injected into the amplifier. The bandwidth of the feed-forward circuit is approximately 2 GHz.

Figure 8:
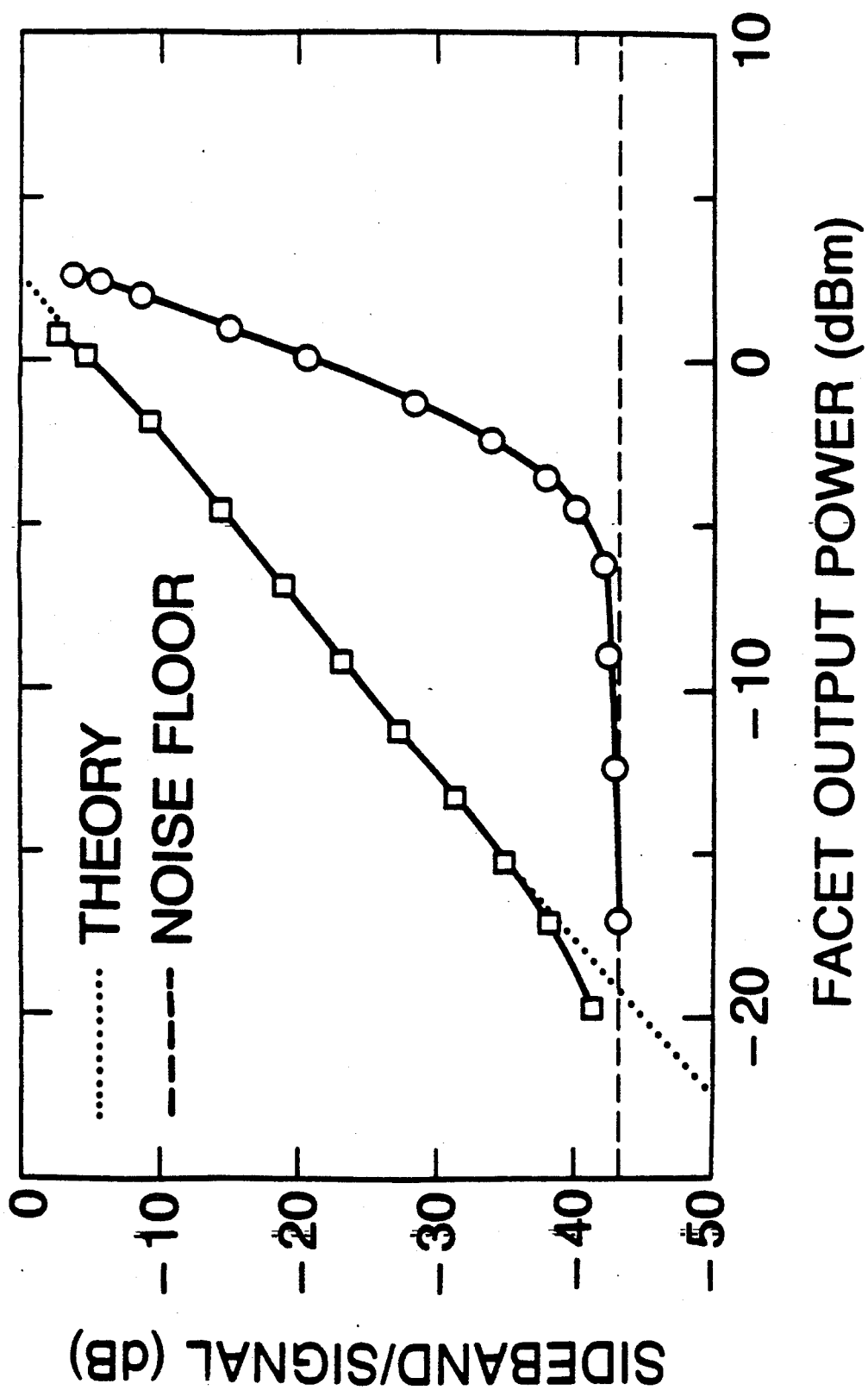
FIG. 8 is a representation of the measured crosstalk for the system of FIG. 7 with (circles) and without (squares) the inventive linearizer.

With full sinusoidal modulation (m=1) applied to L1, the crosstalk induced on L2, with and without the linearizer, is shown as a function of the output power of L1, on FIG. 8. Also shown is the line predicted by Eqn. 15. The reduction of SIC is small for L1 powers that produce substantial gain saturation, but is at least 25 dB (limited by the measurement noise floor) for smaller output powers.

Figure 9:
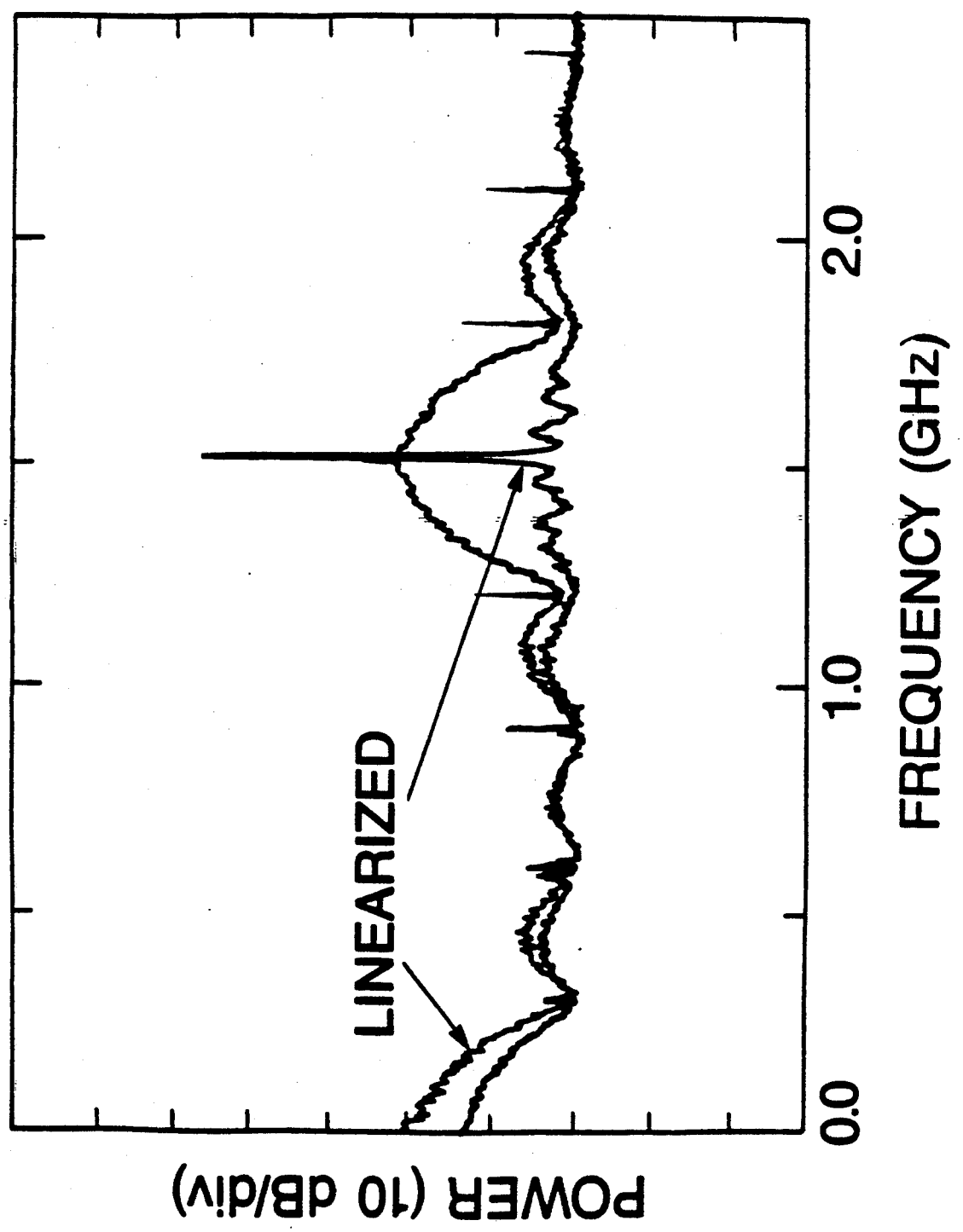
FIG. 9 is a representation of a detected microwave spectrum with and without the inventive linearizer, using 200 Mb/s pseudo random modulation of a BFP laser.

The usefulness of the feed-forward circuit in reducing crosstalk in a digital system is demonstrated in FIG. 9 which shows both the heterodyne-detected spectrum of the amplified L2 signal (centered at 1.5 GHz), when L1 is intensity modulated with 200-Mb/s pseudorandom data, and the direct-detected spectrum of L1 (frequencies less than 600 MHz). Since modulation was not applied to L2, the modulation evident in the amplified spectrum is the crosstalk induced by the amplification of L1. With the linearizer, the crosstalk is reduced by approximately 20 dB. Also, as evident from the 6-dB difference shown at zero frequency in FIG. 9, the effective gain of the amplifier is increased by 3 dB (optical).

What is claimed is:

1. An optical amplifier comprising,
   (a) an optical gain medium,
   (b) means for coupling light into the optical gain medium,
   (c) means for coupling light out of the optical gain medium, and
   (d) means for coupling pumping energy into the optical gain medium, The Invention Characterized in that
   the amplifier further comprises a compensation loop which provides additional gain to the amplifier gain medium as the light coupled into the optical gain medium increases,
   whereby, signal-induced variations in the gain of the optical amplifier are reduced.

2. The device of claim 1 wherein the compensation loop is a feed-forward loop between the means for coupling light into the optical gain medium and the means for coupling pumping energy into the optical gain medium.

3. The device of claim 1 wherein the compensation loop is a feedback loop between the means for coupling light out of the optical gain medium and the means for coupling pumping energy into the optical gain medium.

4. The device of claim 1 wherein the compensation loop has a substantially flat frequency response.

5. The device of claims 1 wherein said additional gain is responsive to variations in the instantaneous optical signal power.

6. The device of claim 1 wherein the optical amplifier comprises a semiconductor.

* * * * *